United States Patent [19]
Etheridge et al.

[11] Patent Number: 5,530,454
[45] Date of Patent: Jun. 25, 1996

[54] DIGITAL OSCILLOSCOPE ARCHITECTURE FOR SIGNAL MONITORING WITH ENHANCED DUTY CYCLE

[75] Inventors: Eric P. Etheridge, Beaverton; Gordon W. Shank, Portland; Daniel G. Knierim, Beaverton, all of Oreg.

[73] Assignee: Tektronix, Inc., Wilsonville, Oreg.

[21] Appl. No.: 227,213

[22] Filed: Apr. 13, 1994

[51] Int. Cl.$^6$ .................................................. G09G 5/36
[52] U.S. Cl. ........................................ 345/134; 345/147
[58] Field of Search .................................. 345/134, 133, 345/135, 147, 148, 149, 185, 186, 201, 150; 324/121 R; 364/487

[56] References Cited

U.S. PATENT DOCUMENTS

| | | | |
|---|---|---|---|
| 4,510,571 | 4/1985 | Dagostino et al. | 345/134 |
| 4,516,119 | 5/1985 | Fukuta | 345/140 |
| 4,752,714 | 6/1988 | Sonneborn et al. | 345/134 |
| 4,878,194 | 10/1989 | Nakatsugawa | 364/487 |
| 4,940,931 | 7/1990 | Katayama et al. | 345/134 |
| 5,134,337 | 7/1992 | Kongslie et al. | 345/147 |
| 5,254,983 | 10/1993 | Long et al. | 345/203 |
| 5,283,596 | 2/1994 | Long | 345/134 |

OTHER PUBLICATIONS

"Low–Cost, 100–MHz Digitizing Oscilloscopes", Robert A. Witte, Hewlett–Packard Journal, Feb. 1992.

*Primary Examiner*—Richard Hjerpe
*Assistant Examiner*—Xiao M. Wu
*Attorney, Agent, or Firm*—Boulden G. Griffith

[57] ABSTRACT

To increase the percentage of time that an input signal is actively monitored, a digital oscilloscope has an acquisition system (100) that includes an analog-to-digital converter (15), an acquisition memory (40), an acquisition rasterizer (50), and a raster acquisition memory (60). The rasterizer contains circuitry (52) for concurrently rasterizing and combining the results of several acquisitions together and with a stored composite raster image to produce a new composite raster image, while additional acquisition records are being created and stored in the acquisition memory. A display system (200) takes the composite raster images after they contain the results of many acquisitions and overlays these single-bit raster images on a multi-bit raster image that is then decremented to produce a simulated persistence effect. The number of new pixels turned on as a result of each acquisition can be counted during the combining process and used to stop acquisitions, signal the operator, or specially treat that particular acquisition when the number of new pixels created by a particular acquisition exceeds a predetermined value. Acquisition circuitry for multiple channels can be used on one channel to further increase the percentage of time that the signal is monitored.

18 Claims, 4 Drawing Sheets

CONTROLLER BEHAVIOR
6. LOAD TRIGGER INFORMATION INTO RASTERIZER, AND START RASTERIZER
7. ALLOW RASTERIZER TO INITIALIZE
8. UNPAUSE RASTERIZER
9. PAUSE RASTERIZER AND CAUSE START ACQ
10. WAIT UNTIL RASTERIZER IS FINISHED

DIGITAL OSCILLOSCOPE ARCHITECTURE FOR SIGNAL MONITORING WITH ENHANCED DUTY CYCLE

FIELD OF THE INVENTION

This invention relates to system architectures for digital oscilloscopes, and more particularly to a system architecture for a digital oscilloscope that is capable of providing a much higher duty cycle of input signal monitoring than has previously been possible in a digital oscilloscope.

BACKGROUND OF THE INVENTION

In typical digital oscilloscopes of the prior art, the signal being monitored is actually sampled by the oscilloscope during a very small percentage of the time that the scope is presenting the display to the user. During the balance of the time, the scope is "blind" to the signal activity. At best, this can be frustrating to a user who is trying to see an intermittent problem. In the worst case, the user is unaware of this limitation and erroneously thinks that the signal is being monitored for a much higher percentage of the time than is actually the case.

In typical analog oscilloscopes of the prior art the voltage versus time behavior of the signal being observed is presented in real time on a cathode ray tube (CRT) display. An electron beam is moved horizontally across the display at a constant rate that is determined by a timebase setting. As the electron beam moves horizontally at this constant rate, the time-varying voltage level of the signal being observed controls the vertical position of the electron beam.

Even though the electron beam may be moving far too quickly to be perceived by the human eye, repetitive signals can still be perceived because of the persistence that is inherent in the light emitted by the phosphor coating of the CRT. Typically, for a repetitive signal to be visible to a human observer, the sweep across the CRT must be repeated at many times per second, with the exact number depending on other factors such as the beam intensity. The actual sweep speed can be much faster, e.g., 10,000 or more updates per second. Depending on how much or how little a "trigger holdoff" control is applied, the signal being monitored may actually be visible on the face of the CRT up to 90% of the time or more.

The analog system just described has, however, one major limitation which is important to the present discussion, i.e., that rare, anomalous, non-repetitive events will usually go completely undetected, since by definition they are not repetitive enough to appear on the display as often as is necessary for perception by the human eye. To compensate for this limitation, the display can be enhanced by the use of an electron multiplying faceplate, such as the microchannel plate system described in U.S. Pat. No. 4,752,714 to Sonneborn et al. for "Decelerating and Scan Expansion Lens System for Electron Discharge Tube Incorporating a Microchannel Plate" and U.S. Pat. No. 5,134,337 to Kongslie et al. for a "Projection Lens Assembly for Planar Electron Source", both of which are hereby incorporated by reference. An analog oscilloscope having a display enhanced by this microchannel plate technology can amplify a rare event to make it visible, so that such an event remains perceptible to the human eye for more than a second after only a single occurrence.

Unfortunately, microchannel plate technology is relatively expensive and, because of the high beam intensities that it generates, it is also prone to causing damage to the CRT phosphor unless the CRT is protected from overexposure to the beam. When the intensity of such a system is turned up to view a rarely occurring signal anomaly, protective circuitry designed to avoid CRT burning will automatically reduce the intensity to avoid damage. This automatic dimming during operation creates a tension between the operator's desires and the display system's limitations, and this can be irritating and frustrating to the user. And, since this is an analog system in which the signal is displayed but not digitized and stored, it is not possible to store a waveform for later viewing.

In digital oscilloscopes the signal whose behavior is being monitored is sampled at regular intervals and each of these samples is quantized as a digital number that can be stored and otherwise processed before it is displayed. Typically, incoming analog waveform data is quantized into numerical values by an analog-to-digital converter at regular intervals determined by an acquisition clock signal. These numerical values are stored in acquisition memory at locations corresponding to successive time increments. A waveform processor performs any desired manipulations of this data, and stores the results in a display memory. A display controller then accesses the contents of the display memory and presents the resulting waveform on a display.

In a first type of digital oscilloscope, the quantized sample values are processed as desired and then converted back to analog voltages for display on a conventional CRT. In this type of system the maximum display update rate is typically about 50 to 60 times per second because considerable processing and display time is associated with each display cycle. If the sweep speed of such an oscilloscope corresponds to 10,000 records per second, but only 50 or 60 of these potential records are actually processed and displayed, that means that less than one percent of the signal's behavior is available for viewing by the operator and more than 99% is lost from view. Such a characteristic seriously detracts from any possibility of finding an intermittent event of interest.

In a second type of display system for digital oscilloscopes, the display is stored in a digital bit map and presented on a raster scanning CRT display without ever being converted back into an analog signal. In this type of system the maximum display update rate is about 70 times per second because rasterization is typically performed by software and a microprocessor, and this requires that a lot of time be devoted to processing the contents of each display. Thus, for sweep speeds corresponding to 10,000 records per second, less than one percent of the signal's actual activity is available for viewing by the oscilloscope operator, so the chances of finding random anomalous signal behaviors is very small and when such behaviors are captured they are not visible to the human eye unless they happen to be stored and held for non-realtime viewing. The bit map type display can be made to behave more like a conventional analog CRT type display by causing the contents of the bit map to decay over time as newly acquired signal traces are added to it.

Once a rasterized image is created, it can be displayed indefinitely, which is sometimes known as "infinite persistence", or it can be caused to decay over time to emulate the normal persistence of the phosphor CRT screens used in analog oscilloscopes. U.S. Pat. No. 5,254,983 to Long et al. for "Digitally Synthesized Gray Scale for Raster Scan Oscilloscope Displays", hereby incorporated by reference, discloses a method for digitally creating the effect of persistence, i.e., intensity that diminishes as a function of time. Pending applications by Alappat et al. having Ser. Nos. 07/149,792 and 07/563,656 disclose similar and related techniques for creating digital persistence effects.

It would be highly desirable to have a digital oscilloscope that allowed a user to observe an input signal for a much higher percentage of the time than has heretofore been available, and that allowed a user to reliably see input signal anomalies even when they occur only intermittently. Having these capabilities in a digital oscilloscope is important for several reasons. Digital oscilloscopes allow storage of acquired waveforms, have relatively unlimited record lengths, and permit the acquisition of information that occurs before a triggering event. They also have superior display accuracy because a raster-based display is not subject to CRT errors.

One step in the desired direction has been taken in the design of the Hewlett-Packard 54600 Series digital oscilloscopes. As is described in an article in the February 1992 Hewlett-Packard Journal entitled "A High-Throughput Acquisition Architecture for a 100-MHz Digitizing Oscilloscope", these digital oscilloscopes were designed to seem more like analog oscilloscopes to their users. To achieve this, rasterization in software was replaced by rasterization in dedicated hardware. However, the total throughput of this system is limited by the fact that the raster image memory (video RAM) is used both to provide the raster image to the display and to receive the output of the rasterization hardware. This dual use of the raster image memory means that it cannot achieve the throughput possible with the invention to be described below.

SUMMARY OF THE INVENTION

A new oscilloscope architecture according to the present invention increases the percentage of time that an input signal is actively monitored. In this architecture, the acquisition system includes an acquisition rasterizer and a raster acquisition memory, as well as an analog-to-digital converter and an acquisition memory. The rasterizer contains circuitry for concurrently rasterizing and combining the results of several acquisitions together and with a stored composite raster image to produce a new composite raster image, while additional acquisition records are being created and stored in the acquisition memory. A display system containing another raster memory takes the composite raster images after they contain the results of many acquisitions and overlays these single-bit raster images on the multi-bit raster image in the display raster memory. The pixels of this image may then be decremented to produce a simulated persistence effect. The number of new pixels turned on as a result of each acquisition can be counted during the combining process and used to stop acquisitions, signal the operator, or specially treat that particular acquisition when the number of new pixels created by a particular acquisition exceeds a predetermined value. Acquisition circuitry for multiple channels can be used on one channel to further increase the percentage of time that the signal is monitored.

By compositing a number of acquired waveforms into a single raster image at high speeds and then shipping the resulting composite waveform image to the display system for combining with previous composite waveform images, this digital oscilloscope architecture provides significantly higher "live" time, i.e., time during which the input signal is being actively monitored. This is made possible because of the large amount of high speed data manipulation and compression that can be accomplished in the rasterizing acquisition system without loading down the display raster memory. With the display system's raster memory largely insulated from the rasterization process, it can be a much lower speed memory than the high-speed acquisition raster memory and still have plenty of bandwidth for screen updates.

DETAILED DESCRIPTION OF THE INVENTION

Co-pending U.S. patent application Ser. No. 08/043,079 by Meadows et al. for "Slow Display Method for Digital Oscilloscope with Fast Acquisition System", hereby incorporated by reference, discloses a method for compositing a number of digitized waveform acquisitions using a probabilistic O-Ring function to produce a composite waveform for a slow raster display employing liquid crystal technology. That display somewhat resembles the display of an analog oscilloscope, but the relatively fast acquisition system described in that patent application still has limited "live" time when it is actively monitoring the signal under test.

Figure 1:
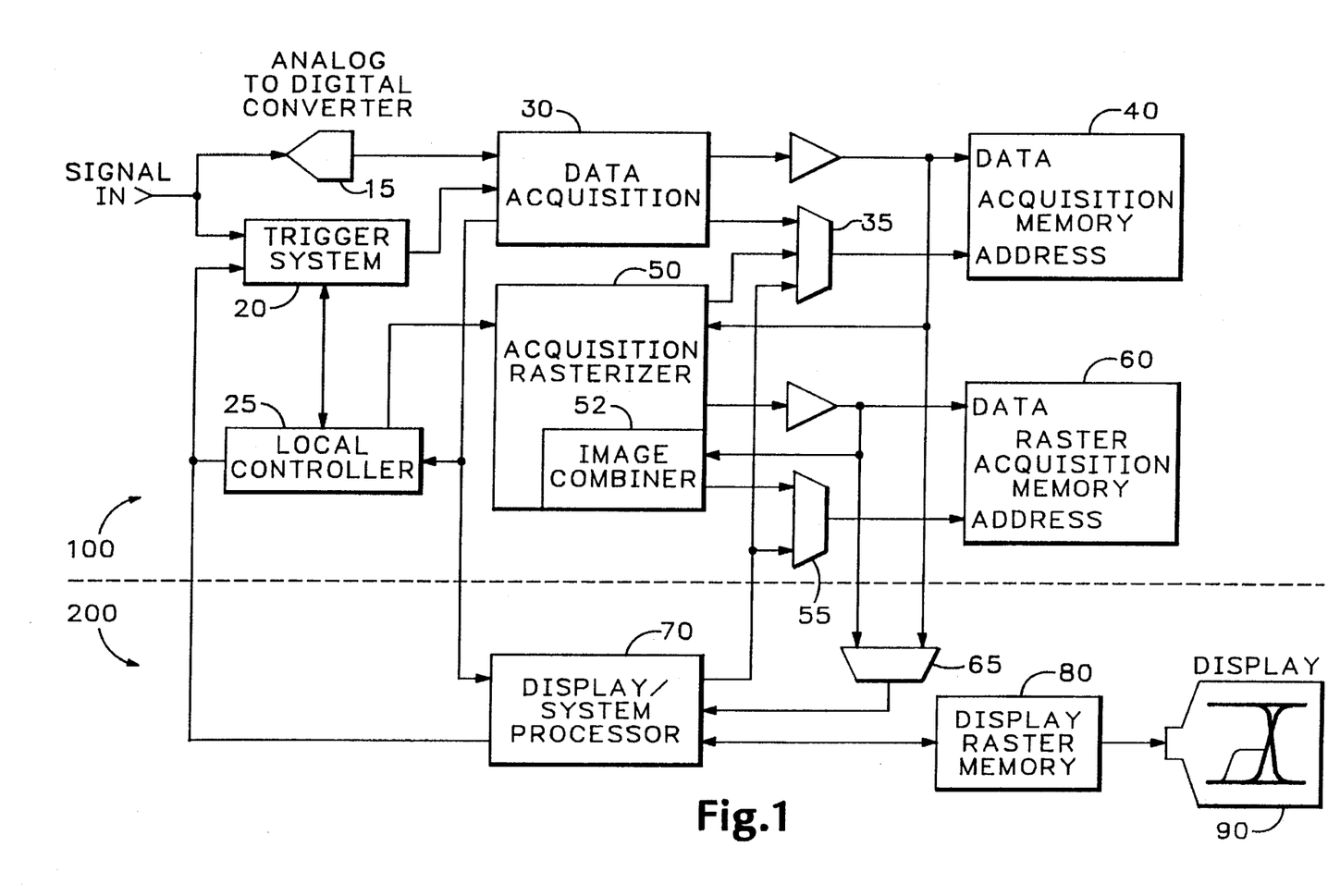
FIG. 1 is a simplified block diagram of the architecture of a digital oscilloscope according to the present invention.

Referring to FIG. 1, a digital storage oscilloscope according to the present invention in its simplified form is like other digital storage oscilloscopes in that it has two main parts, an acquisition system 100 shown above the dotted horizontal line and a display system 200 shown below the dotted line. These two parts, the acquisition 100 and display 200 systems, are different from their counterparts in other oscilloscopes in what they contain and how they operate.

As in previous systems, an input signal is applied to an analog-to-digital converter 15 and to a trigger system 20, both of which are conventional and well known in the prior art. The analog-to-digital converter 15 converts the continuously varying input analog signal into a series of digital values representative of the instantaneous voltage values of the input signal at a series of discrete times. Ideally, these discrete times are separated by equal time intervals. The data acquisition circuitry 30 demultiplexes and decimates the series of digital voltage values before sending them to the acquisition memory 40. The decimation factor and method employed by the data acquisition circuitry 30 is determined by operator settings.

The trigger system 20 is armed by signals from the display/system processor 70 and/or the local controller 25 that tell it to start an acquisition. (In one embodiment of the invention, the local controller 25 and the trigger system 20 are shared by four acquisition systems 100.) When it is first armed, the trigger system 20 notifies the data acquisition circuitry to start collecting pre-trigger samples and forward them to the acquisition memory 40. After enough pre-trigger samples have been stored to fill a circular pre-trigger portion of the acquisition memory 40, the trigger system 20 is ready to generate a trigger when its preprogrammed trigger criteria are met. While the trigger system is waiting for the trigger condition to be satisfied, the data acquisition circuitry continues to write data into the circular buffer, overwriting earlier pre-trigger data as necessary. After the trigger occurs, the data acquisition circuitry 30 fills that portion of the acquisition memory 40 space that is reserved for post-trigger data.

Figure 2A:
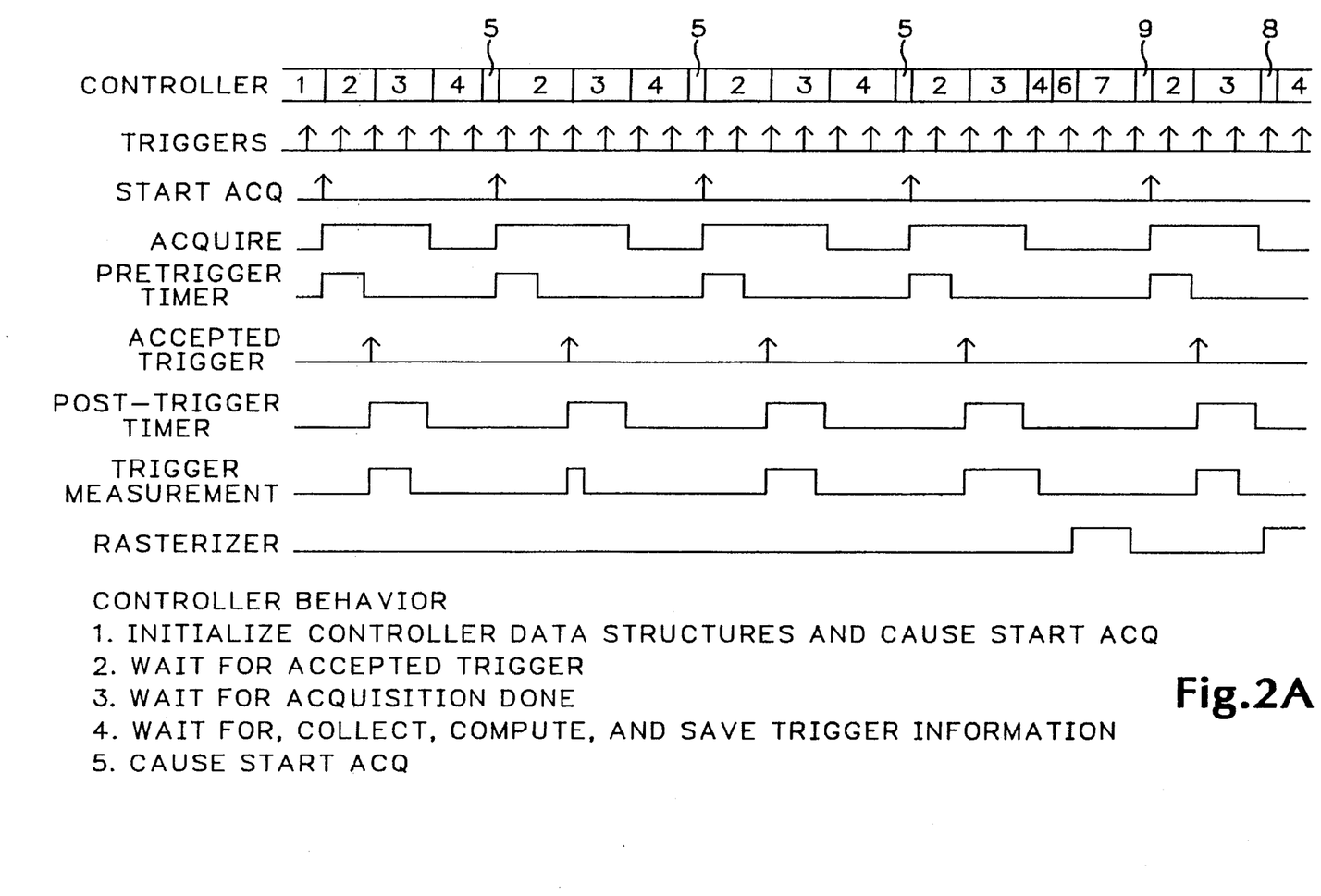
FIGS. 2A & 2B are a timing diagram illustrating the operation of the digital oscilloscope architecture of FIG. 1.
Figure 2B:
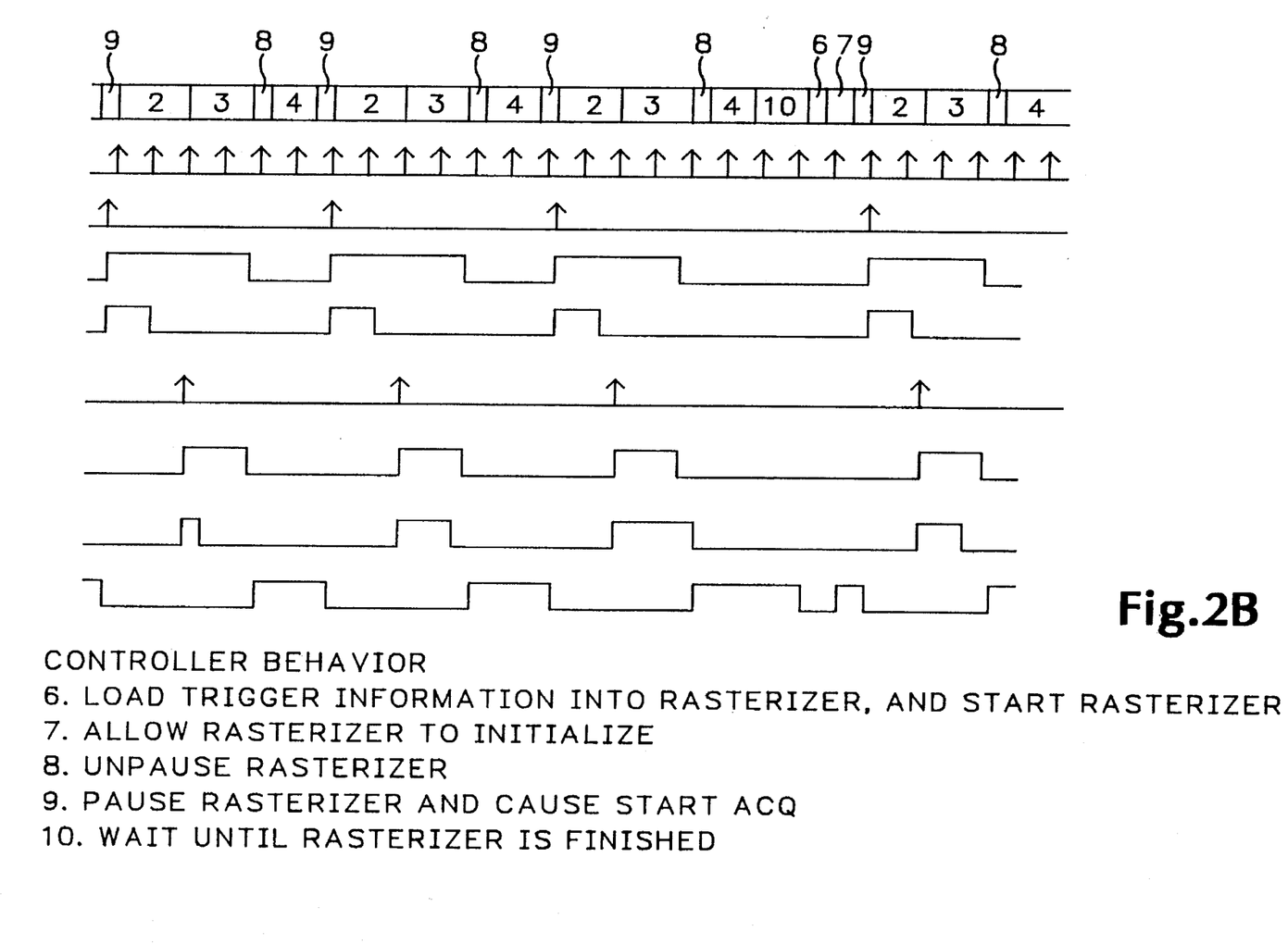

Referring now to FIGS. 2A & 2B, which are a timing diagram illustrating the operation of the digital oscilloscope architecture of FIG. 1, the top entry in this Figure is the type of activity being dictated by the local controller 25 shown in FIG. 1. During activity type 1 the local controller initializes its data structures. When it is done, the controller generates a start acquisition signal. Any triggers that occur during this interval are ignored.

The start acquisition signal (line 3) starts a pretrigger timer (line 5), as well as the acquisition (line 4). During activity type 2 the local controller 25 is waiting for an accepted trigger (line 6). No trigger can be accepted until the pretrigger timer time has expired. The pretrigger timer value is calculated to allow an appropriate number of pretrigger samples to be acquired, as determined by operator settings. After the pretrigger timer has timed out, the trigger system 20 accepts the next trigger as an accepted trigger and the activity type changes to 3.

Activity type 3 is waiting for an acquisition to be done, i.e., waiting for the post-trigger timer (line 7) to time out. After the post-trigger timer's time interval expires, activity type 3 ends and activity type 4 begins. During activity type 4 the local controller 25 first waits for the trigger measurement (line 8) to be completed, then collects the exact trigger timing information from the trigger system 20 and saves it internally. When these operations are complete activity type 4 ends and activity type 5 begins.

Trigger measurement time (line 8) is the time spent by the trigger system 20 determining exact trigger timing. The trigger system 20 contains a precision analog time measurement circuit which is capable of timing resolution much more exact than the period of the system clock in the rest of the oscilloscope. The exact times measured by the trigger system 20 have to be converted to a digital value for use later in the time aligning of data from different acquisitions. This takes a significant amount of time, and this time becomes an important factor in connection with acquisitions at the highest sweep speeds, as will be further described below.

During activity type 5 the local controller 25 goes through a short cycle of internal activity and then generates another start acquisition signal (line 3). After four acquisitions have been made in this manner, the local controller engages in activity type 6 instead of activity type 5. During activity type 6 the local controller 25 loads trigger information into the rasterizer 50 and then starts it running. Overall throughput is increased by rasterizing four acquisitions concurrently.

Referring again to FIG. 1, to allow the simultaneous rasterization of four acquisitions at once, four sequential acquisitions are made into different portions of the acquisition memory 40. There are a total of eight such acquisition storage locations in each acquisition memory 40, so that four can be used for storing more data while the other four are being read out by the acquisition rasterizer 50.

Furthermore, there are four sets of all of the circuitry of the acquisition system 100 shown in the upper portion of FIG. 1, except that there is only one trigger system 20 and it is shared by those four acquisition systems 100. These acquisition systems 100 are each associated with a separate channel of a four channel digital oscilloscope. The display system 200, which is shown below the dotted line in FIG. 1, interacts sequentially with all four of the acquisition systems, allowing three to continue with acquisition and rasterization activities, while composite data from the fourth one is being transferred out.

Referring now again to FIGS. 2A & 2B, as well as FIG. 1, during activity type 6, trigger information is loaded into the acquisition rasterizer 50 (also known as a "pixelator") and then the acquisition rasterizer 50 is started (line 9). When the acquisition rasterizer 50 starts running it takes control of multiplexer 35 and through it controls the addressing of the acquisition memory 40 so that it can read out its contents. The contents of each acquisition are read out in eight byte words, with sequential words coming from portions of acquisition memory 40 associated with different acquisitions. There are four buffers in the acquisition rasterizer 50, one for each of the acquisitions being read out of acquisition memory 40. Exact trigger location information supplied by the local controller 25 allows the acquisition rasterizer to time align the data from the four different acquisitions so that they may be simultaneously rasterized and combined into one raster image by the image combiner 52.

As the four images are combined (ORed) with each other, they are also combined with the previous raster image stored in raster acquisition memory 60, if one has already been stored there. To accomplish readback of the previous raster image from the raster acquisition memory 60 and its replacement with a new composite raster image, the acquisition rasterizer 50 also takes control of multiplexer 55, and through it controls the addressing of the raster acquisition memory 60 while it is rasterizing.

The rasterization process involves the conversion of eight bits (or nine in a high resolution mode) of voltage amplitude information into one bit of "on" information in one of 256 vertical locations in the raster (512 in high resolution mode). Thus, there is a considerable data expansion involved in the rasterization process. However, the compositing of multiple raster images into one final image results in large scale data compression, so the overall effect is to simplify and compress the data passing from the acquisition system 100 to the display system 200.

Continuing with the explanation of FIGS. 2A & 2B, as was noted above, during activity type 6 the local controller 25 loads trigger information into the rasterizer 50 and then starts it running. During activity type 7 the rasterizer 50 initializes itself, which includes reading in and time aligning the initial data for all four acquisitions now ready in the acquisition memory 40.

During activity type 9 the local controller 25 pauses the rasterizer 50 and starts another acquisition, which leads to another instance of activity type 2 and activity type 3, waiting for an accepted trigger and completion of another acquisition. However, when this acquisition is complete the local controller 25 unpauses the rasterizer (activity type 8) so that it can work on rasterizing the previous four acquisitions. While the rasterizer is working, the local controller 25 collects, computes, and saves the trigger information associated with the last acquisition, acquisition number five in our present example. This is the first acquisition of the second group of four.

The pattern of activity types just described, 9, 2, 3, 8, and 4, is repeated three more times, during which time the next set of four acquisitions is completed while the last four are being rasterized in parallel. Since four new acquisitions are now ready for rasterization, the rasterizer 50 is now allowed to run (activity type 10) until the rasterizer is finished. When that rasterization is finished, the next set of trigger information is loaded into the rasterizer 50 (activity type 6) and the rasterizer is allowed to initialize (activity type 7). The system then returns to progressing through the 9, 2, 3, 8, and 4 pattern of activity types as it continues rasterizing and acquiring additional data in a time sharing manner.

The times shown in FIGS. 2A & 2B are nominal values, but it should be understood that the relative times needed for these activities varies with the sweep speed selection made by the operator. At high sweep speeds, the trigger system 20 has the most effect on limiting the overall throughput of the acquisition system 100 because it takes a relatively long time to collect, compute, and save the trigger information (activity type 4). At intermediate sweep speeds the rasterizer 50 (activity type 10) contributes the most to overall system "dead time". The trigger system's contribution to dead time is no longer significant at the slower sweep speeds because at those speeds there is no need for the detailed trigger position information that takes the most time to determine. At the slowest sweep speeds, such as 10 μs/div or 100 μs/div, the acquisition itself (activity type 3) takes so long that all other times are relatively unimportant. It is at these slowest sweep speeds that coverage most closely approaches 100%, but even at these speeds a certain amount of time is lost to the events shown in FIGS. 2A & 2B. At the highest sweep speeds the signal may still go unmonitored for up to 80% of the time, but this is still a several thousand-fold improvement over most systems of the prior art.

The coverage of one channel can be increased for use at the higher speed sweeps if the hardware for the other three channels is all applied to assisting the one channel. As has been described above, all of the acquisition system 100 hardware shown above the dotted line in FIG. 1 is duplicated for each channel of the digital storage oscilloscope. In a special mode of operation the display/system processor 70 can cause all four acquisition systems 100 to monitor the same channel at sequential times, thus boosting the coverage by a factor of four. This interleaving of sets of acquisitions resembles, but is actually quite different from, interleaving at the sample-by-sample or clock-by-clock level that has been done in the past to boost the sample rate of one channel at the expense of the availability of other channels. Sample-by-sample or clock-by-clock interleaving allows faster operation for short durations, while this type of acquisition-by-acquisition interleaving provides more complete coverage over an extended interval, i.e., a higher duty factor for active monitoring of the signal.

In either mode of operation described above, once a large number of acquisitions have been composited into one raster image, that image has to be transferred from raster acquisition memory 60 of the acquisition system 100 to the display raster memory 80 of the display system 200. This process is accomplished by the display/system processor 70, which takes control of multiplexers 55 and 65 in order to address and receive data from the raster acquisition memory 60. The interval between successive readouts of the acquisition system 100 by the display system 200 is chosen to give the oscilloscope operator enough updates to make the display seem like it is realtime, but no more than absolutely necessary for this purpose, since every readout of a composite raster by the display system 200 causes the acquisition system 200 to be unavailable for acquisitions for additional time.

In a mode of operation that is an alternative to the modes available in accordance with the present invention, neither the acquisition rasterizer 50 nor the raster acquisition memory 60 are used and the display/system processor 70 directly reads out the contents of the acquisition memory 40 by taking control of multiplexer 35 for addressing and multiplexer 65 for readback.

It should also be noted that while the raster acquisition memory 60 is shown in FIG. 1 as being separate and distinct from the acquisition memory 40, in actuality they can be different portions of the same physical memory. Then, when other modes of operation are selected, that memory area can be used for more acquisition memory space. Since a lot of high-speed acquisition memory is required by some modes and not by others, this extra memory is available for use in accordance with the present invention without much additional overall cost.

Because the acquisition memory 40 and raster acquisition memory 60 are actually one wide high-speed memory, how efficiently that memory can be shared is an important design consideration. The overall bandwidth of this memory is dictated by the maximum sampling rate of the digital oscilloscope that it supports. The design of the acquisition rasterizer 50 is optimized to work with the limitations imposed by the acquisition/raster memory 40,60. This is why four rasterizations are performed concurrently and why the results of all four rasterizations are combined with the existing raster image in one set of operations. Because one of the goals of this design is to optimize memory bandwidth utilization efficiency, the acquisition rasterizer 50 operates to keep the acquisition/raster memory 40,60 busy at all times with either a memory read or a read-modify-write cycle.

Figure 3:
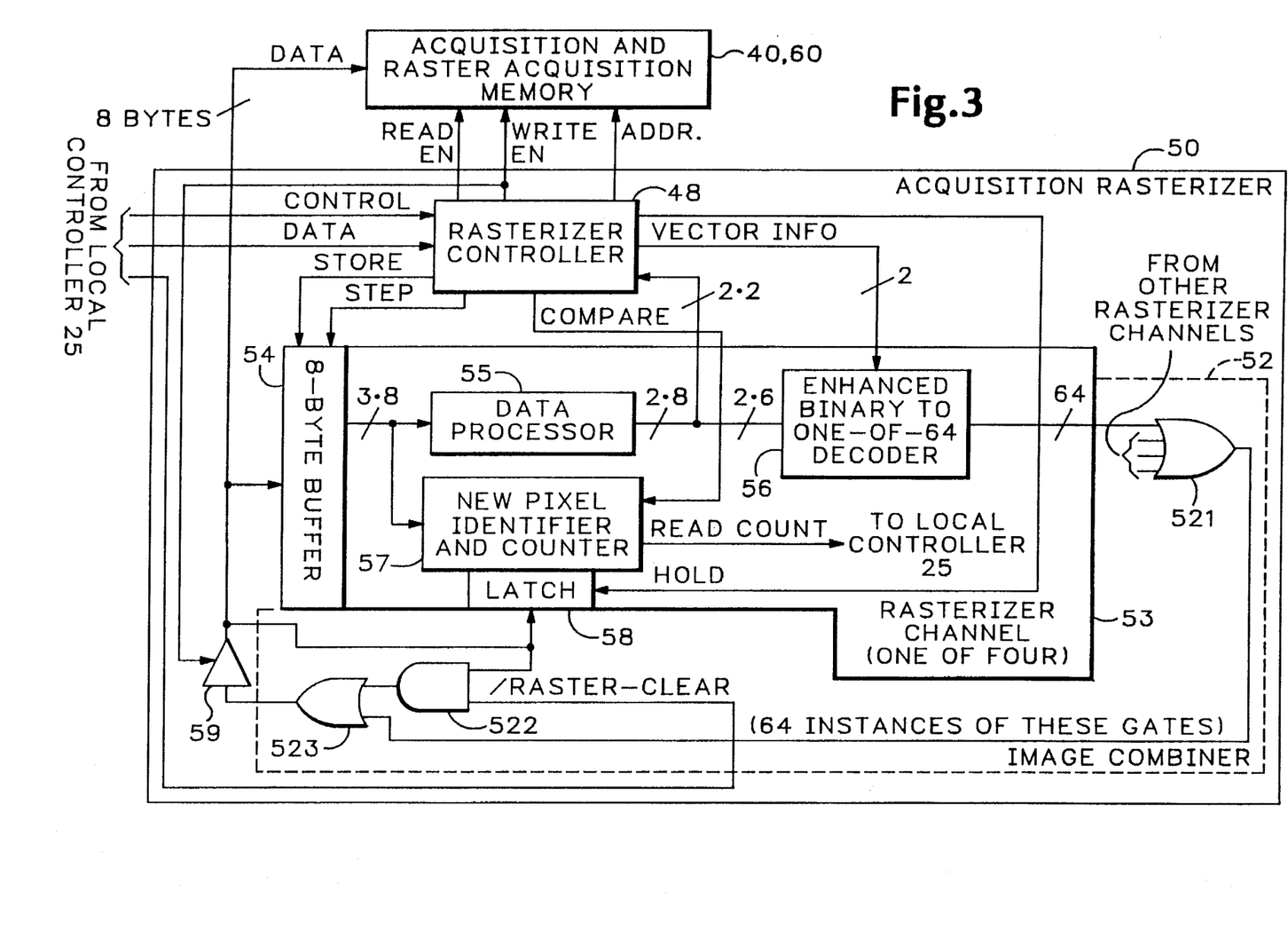
FIG. 3 is a simplified block diagram of the acquisition rasterizer shown in FIG. 1 and its interaction with the acquisition/raster memory.

Referring now to FIG. 3, the acquisition rasterizer 50 contains its own rasterizer controller 48 which receives CONTROL, DATA, and/RASTER-CLEAR (not raster clear) signals from the local controller 25 shown in FIG. 1. The CONTROL signals activate and pause the rasterizer 50 and tell it what mode the acquisition system is in, while the DATA contains the coarse and fine trigger position information that the rasterizer needs to properly address the acquisition memory 40 and time align the data that it receives from that memory. The/RASTER-CLEAR signal tells the image combiner 52 when old raster data should be erased.

The rasterizer controller 48 addresses and reads data from the 8-byte wide acquisition/raster memory 40,60 and sends a STORE signal to the 8-byte buffer 54 in the appropriate rasterizer channel 53 when the data is ready. The 8-byte buffer 54 stores the 8 bytes of acquisition data in parallel in response to the STORE signal, and then those bytes of data are stepped forward through the 8-byte buffer 54 by the STEP signal to properly time align them in the different rasterizer channels 53 before the rasterization process is begun.

In a normal resolution mode of operation each byte of data represents the vertical (amplitude) value of the input signal at one point in time. In a high resolution mode of operation two bytes of data are needed to describe the vertical location of the signal at one point in time. Two bytes of data are also required for normal resolution in a min/max (also known as "peak detect") mode of operation.

After the data in the different rasterizer channels is properly time-aligned, the appropriate byte or bytes of data from the 8-byte buffer 54 is presented to the data processor 55. In a dot mode of operation, in which the waveform data is displayed as a series of dots without interpolation, only a single byte of data is needed by the data processor 55. In a vector mode of operation, in which the rasterizer interpolates between successive dots in the record to make an analog-like display, the data processor 55 requires three bytes of data, the present byte and the ones before and after the present one. In the min/max (peak detection) mode of operation two bytes of data are also needed; one to describe the location of the maximum value and the other to describe the minimum value.

In the dot mode of operation the data processor 55 does not need to perform any operations on the single byte of data that it receives, but only passes it on to the enhanced binary to one-of-64 decoder 56 and the rasterizer controller 48, with six bits going to the former and two bits going to the latter. In this mode the VECTOR INFO signals from the rasterizer controller 48 put the enhanced binary to one-of-64 decoder in its simplest mode in which it performs a straightforward decode of the six bits on its input. In response to this decode, one of the 64 output lines from the enhanced binary one-to-64 decoder 56 is activated.

It should be understood that in the described embodiment the display raster of display 90 has 512 vertical locations, but only 256 locations, i.e., every other one, are used in the normal resolution mode. However, 256 locations of vertical information is four times as much information as can be stored in the 64-bit wide acquisition/raster memory 40,60. Therefore, the 256 vertical raster locations are divided into four separate 64-wide blocks in the raster portion of acquisition/raster memory 40,60. The two bits of higher order information that goes to the rasterizer controller 48 allows it to determine which of the four blocks is to be affected by a particular decode operation.

In the vector mode of operation the data processor 55 passes two bytes of information to the enhanced binary to one-of-64 decoder 56, one byte specifying the top of a range and the other byte specifying the bottom of a range. The enhanced binary to one-of-64 decoder 56 actually contains two such decoders and some other specialized logic which is further described below. By interpolation between the preceding point and the present one, and between the present point and the next one, the data processor 55 determines the range of pixels in the present vertical raster column that should be turned on. Those pixels are the ones between the minimum and maximum of three values: the average of the last and present data points, the current data point, and the average of present and next data points. The two bytes passed on to the decoder 56 define the endpoints of that range. If the range of pixels that should be turned on extends beyond the present block of 64, the rasterizer controller 48 determines this from the two highest order bits from one or both of the two bytes of information supplied by the data processor 55. By controlling the status of the VECTOR INFO bits that it sends to the decoder 56, the rasterizer can direct the decoder ignore one or both of its 6-bit inputs.

As an example, let us suppose that an input signal made a sharp vertical transition in the vicinity of the present pixel column and that as a consequence of this the total number of pixels to be turned on in the present column extends through portions of three of the four groups of 64 pixels. Thus, the bottom end point defined by one of the bytes put out by the data processor 55 falls in the lowest group of pixels and the two highest order bits from this byte are "00". The top end point defined by the other byte falls in the third lowest group of pixels and the two highest order bits from this byte are "10". In response to this condition, the rasterizer controller 48 first sends a VECTOR INFO code to the decoder 56 which says in effect: "Ignore the top end point and make all pixels above the low end point active". And then, after that "00" portion of the raster has been processed, it sends another VECTOR INFO code to the decoder 56 which says in effect: "Ignore both endpoints and make all pixels active." Then, after that "01" portion of the raster has been processed, it sends another VECTOR INFO code to the decoder 56 which says in effect: "Ignore the bottom end point and make all pixels below the top end point active." It then processes the "10" portion of the raster while the decoder is responding to this code. Thus, under different conditions the modification of one raster column can take from one to four read-modify-write cycles, depending how many blocks of 64 pixels must be modified. The ability to act appropriately in response to the VECTOR INFO controls is what makes decoder 56 "enhanced".

The need to modify more than one block of 64 pixels can arise in two other ways: either because min/max mode values extend over more than a single block, or because pixels activated by different acquisitions fall into more than one block of 64 pixels. Because each of the four rasterizer channels 53 is processing data from a different acquisition and the behavior of the signal can vary from acquisition to acquisition, and because the rasterizer controller receives the high order bits from the data processors 55 in all four rasterizer channels, high order bit information from different channels can require the rasterizer controller 48 initiate more than one read-modify-write cycle per raster column. However, in the usual case most points in successive waveform acquisition tend to land within the same 64 bit block, thus allowing quite efficient memory bus bandwidth utilization. When the raster is being cleared (/RASTER-CLEAR low), all four blocks of raster image must be accessed at every location in order to erase the old data that may be stored there. This is an infrequently performed operation, however, and does not significantly affect overall throughput.

The 64 lines of output from all four rasterizer channels 53 are each respectively ORed into 64 OR gates 521 of image combiner 52. The outputs of the 64 OR gates 521, representing the activity of the signal during the four acquisition presently being rasterized, are ORed with the outputs of 64 AND gates 522 by 64 OR gates 523. AND gates 522 have the retrieved raster data read from the acquisition/raster memory 40,60 on one input and /RASTER-CLEAR (not raster clear) on the other input. When /RASTER-CLEAR is low all of the AND gates 522 are disabled and the raster image produced is based entirely on the outputs of the OR gates 521. When /RASTER-CLEAR iS high old pixel data is combined with new data from the present rasterization to produce composite raster images. The image combiner thus implements the modify portion of a read-modify-write cycle which changes from read to modify-write when the WRITE ENable signal causes tristate buffer 59 to begin passing its input to the data bus connected to the acquisition/raster memory 40,60.

It should be understood that FIG. 3 is a simplified block diagram and that there are a lot of pipeline stages through all the parts of each rasterizer channel and that the read-modify-write cycle that the image combiner operates in conjunction with is delayed about 20 clock cycles in time from the data read cycle that loaded the 8-byte buffer 54 with the corresponding acquisition data.

The new pixel identifier and counter 57 receives the byte of information representing the location of the present pixel and decodes it using an internal decoder (not shown). The decoder in the new pixel identifier and counter 57 is similar to the decoder 56, but does not have the enhancements that allow it to respond to VECTOR INFO. The present pixel location information decoded from the present byte is compared upon receipt of the COMPARE signal with similar information which was stored by latch 58 in response to a HOLD command from the rasterizer controller 48. The counter is incremented when the present pixel location was not active in the stored raster image being updated. In min/max (peak detect) mode the new pixel identifier and counter 57 monitors the byte representing the maximum value for new pixel information. By adding another decoder within the new pixel identifier and counter, or by adding another cycle of activity, both the minimum and maximum values could be monitored. The new pixel identifier and counter 57 sends READ COUNT information to the local controller 25 shown in FIG. 1, where it is combined with the new pixel count information from other rasterizer channels 53 before it is sent to the display/system processor 70 (also shown in FIG. 1).

Once the rasterized image is available to the display/system processor 70, additional processing can be accomplished in a variety of ways known from the prior art. U.S. Pat. No. 5,254,983 to Long et al. for "Digitally Synthesized Gray Scale for Raster Scan Oscilloscope Displays", incorporated by reference above, discloses a method for digitally creating the effect of persistence, i.e., intensity that diminishes as a function of time. Pending applications by Alappat et al. having Ser. Nos. 07/149,792 and 07/563,656 disclose similar and related techniques for pseudo persistence.

In the particular digital storage oscilloscope that first embodied the present invention, a multi-bit raster image is maintained in the display raster memory 80 by the display/system processor 70. As new single-bit images are brought in from the acquisition system 100, the display/system processor 70 uses the information in the new single-bit image to update on a pixel-by-pixel basis the image maintained in the display raster memory 80, while also decrementing the pixel values of that image to simulate analog persistence.

In one mode of operation, the rasterizer 50 counts the "new" pixels associated with each acquisition as it is rasterized. Each pixel being read back from the previous composite image stored in the raster acquisition memory 60 is monitored to see if contained a "1". If it did, "1"s in the corresponding location of the new acquisitions being rasterized are not considered to be new. However, if a pixel is "0" in the previous composite image, but is going to be changed to a "1" as the result of activity in one of the acquisitions being rasterized, then a counter associated with that acquisition is incremented to indicate that acquisition was different from previous ones.

This counting of "new" pixels that result from each acquisition provides data that can be used for rapid testing of acquired waveforms to determine if they depart from the ordinary. After a number of acquisitions have established a baseline reference for the waveform being monitored, a new pixel count above a threshold number can be used to distinguish a change in waveform behavior, and can be used to halt acquisitions, save the particular waveform that generated the high new pixel count, or take some other action.

The new pixel count for individual acquisitions can be also be consolidated into a new count for the composited raster image. This new count can then be used by the display/system processor to decide whether some special action should be taken. As a result of such a determination the associated composite waveform image can be stored in a special raster memory (not shown) for future analysis, or that image can be displayed in a different color, or some other indication can be provided to the operator, such as stopping further acquisitions so that this image may be further analyzed.

At the beginning of each new acquisition and rasterization cycle, after the display system 200 has read out the composite raster image from the acquisition system 100, some method must be employed to establish a reference composite raster image before the new pixel counts can be meaningful. One way to do this is to ignore the new pixel counts from a number of the rasterizations performed first until a reference raster image has been formed.

The pixel-by-pixel comparison and counting of "new" pixels can be used in a different way to find waveforms that deviate from a reference template raster image. In this approach, the reference template raster image is downloaded from the display/system controller 70 to the raster acquisition memory 60 before a series of acquisitions is begun. The new pixel count can then be used to identify acquisitions that depart from this reference waveform image.

The oscilloscope architecture shown in FIG. 1 permits dual use of one large acquisition memory as both an acquisition memory 40 and a raster acquisition memory 60. While this approach is very efficient in terms of utilization of this fast and expensive memory resource, it is somewhat inefficient from a time conservation point of view, since the same bus must be time-shared between the two types of activity that use the different parts of this memory. Some further time savings can be achieved by making the raster acquisition memory 60 a completely separate memory with its own dedicated address and data busses, although this adds a significant increment of expense.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A digital oscilloscope comprising:
   an acquisition system (100) including:
   analog-to-digital conversion means (15) for receiving an input analog signal and producing a series of digital samples representative of amplitude values of the input analog signal over time;
   acquisition memory means (40) for storing the series of digital samples;
   an acquisition rasterizer (50) for converting the series of digital samples into a rasterized waveform image;
   raster acquisition memory means (60) for receiving the rasterized waveform image or a composite rasterized waveform image; and
   means for combining (52) a currently produced rasterized waveform image produced by the acquisition rasterizer with a previously rasterized waveform image or a composite rasterized waveform image retrieved from the raster acquisition memory means to produce a composite rasterized waveform image for storage in the raster acquisition memory means; and
   a display system (200) having:
   a display raster memory (80) for storing the composite rasterized waveform image; and
   a display raster (90) for receiving the composite rasterized waveform image from the display raster memory (80) and providing a display of said composite rasterized waveform image.

2. A digital oscilloscope according to claim 1 wherein the display system (200) further comprises:
   display system control means (70) for requesting and receiving the composite rasterized waveform image from the acquisition system (100) and providing said composite rasterized waveform image to the display raster memory (80).

3. A digital oscilloscope according to claim 1 wherein the acquisition subsystem further includes:
   a trigger system (20) for monitoring the input signal and producing a trigger signal; and a local controller (25) for receiving control signals from the display subsystem and producing local control signals for controlling activities of the trigger system (20) and the acquisition rasterizer (50).

4. A digital oscilloscope according to claim 1 wherein in an alternative mode of operation the raster acquisition memory means (60) is used as part of the acquisition memory means (40).

5. A digital oscilloscope according to claim 1 wherein the acquisition memory (40) and the raster acquisition memory 60 are part of a same memory device and share common address and data busses.

6. A digital oscilloscope according to claim 1 wherein the display raster memory (80) contains multiple bits of information to describe an intensity value of each pixel location and composite rasterized waveform images cause incrementing of the intensity value of at least some pixel locations and the intensity value of at least some pixel locations are decremented over time to produce a persistence effect.

7. A digital oscilloscope according to claim 1 wherein the acquisition rasterizer (50) is capable of converting a plurality of series of digital samples into one composite rasterized waveform image during one rasterization operation.

8. A digital oscilloscope according to claim 7 wherein the means for combining (52) combines a previously produced composite rasterized waveform image retrieved from the raster acquisition memory means (60) with the plurality of series of digital samples to produce the composite rasterized waveform image for storage in the raster acquisition memory means (60).

9. A digital oscilloscope according to claim 1 wherein the means for combining (52) counts a number of pixels being turned on for a first time each time a composite rasterized waveform image is produced.

10. A digital oscilloscope according to claim 1 further comprising additional instances of the acquisition system (100), the additional instances of the acquisition system being associated with additional oscilloscope channel input signals.

11. A digital oscilloscope according to claim 10 wherein in an alternative mode of operation multiple acquisition systems (100) can be associated with a single channel's input signal to increase an amount of time that data is acquired from the single channel's input signal.

12. A method for acquiring and displaying a waveform image representative of an input signal's amplitude variation over time, the method comprising the steps of:
(a) sampling the input signal's amplitude repeatedly at substantially uniform time intervals to produce an acquisition record;

(b) rasterizing the acquisition record to produce a raster image;

(c) combining the raster image with a previously stored composite raster image to produce a new composite raster image;

(d) counting during combining step (c) a number of pixels in the new composite raster image that were not active in the previously stored composite raster image;

(e) replacing the previously stored composite raster image with the new composite raster image to produce another previously stored composite raster image;

(f) repeating steps (a) through (e) a plurality of times; and (g) displaying the previously stored composite raster image as the waveform image.

13. A method for acquiring and displaying according to claim 12 further comprising the steps of:

(d1) summing the number of pixels counted in step (d) with a previous sum of pixels associated with the previously stored composite raster image to produce a new sum of pixels; and (e1) substituting the new sum of pixels for the previous sum of pixels and associating the resulting previous sum of pixels with the previously stored composite raster image produced by step (e).

14. A method for acquiring and displaying according to claim 13 further comprising the steps of:

(g1) comparing the previous sum of pixels associated with the previously stored composite raster image with a predetermined value; and (g2) taking some action if the previous sum of pixels bears a predetermined relationship to the predetermined value.

15. A method for acquiring and displaying according to claim 14 wherein the action taken is to display the waveform image in a different color.

16. A method for acquiring and displaying according to claim 14 wherein the action taken is to store the waveform image.

17. A method for acquiring and displaying according to claim 14 wherein the action taken is to stop further acquisitions.

18. A method for acquiring and displaying according to claim 12 further comprising the steps of:

(c1) supplying a reference template raster image as the previously stored composite raster image prior to performing step (c) a first time.

* * * * *